(12) United States Patent
Kakegawa et al.

(10) Patent No.: US 9,466,523 B2
(45) Date of Patent: Oct. 11, 2016

(54) CONTACT HOLE COLLIMATION USING ETCH-RESISTANT WALLS

(71) Applicant: SanDisk Technologies Inc., Plano, TX (US)

(72) Inventors: Tomoyasu Kakegawa, Mie (JP); Takuya Futase, Mie (JP); Katsuo Yamada, Mie (JP); Keita Kumamoto, Mie (JP); Hirotada Tobita, Mie (JP)

(73) Assignee: SanDisk Technologies LLC, Plano, TX (US)

( * ) Notice: Subject to any disclaimer, the term of this patent is extended or adjusted under 35 U.S.C. 154(b) by 128 days.

(21) Appl. No.: 14/445,703

(22) Filed: Jul. 29, 2014

(65) Prior Publication Data

US 2016/0035738 A1 Feb. 4, 2016

(51) Int. Cl.
*H01L 21/768* (2006.01)
*H01L 21/311* (2006.01)
*H01L 21/02* (2006.01)
*H01L 27/115* (2006.01)

(52) U.S. Cl.
CPC ..... *H01L 21/76831* (2013.01); *H01L 21/0217* (2013.01); *H01L 21/31144* (2013.01); *H01L 21/76801* (2013.01); *H01L 21/76802* (2013.01); *H01L 21/76816* (2013.01); *H01L 21/76897* (2013.01); *H01L 27/11524* (2013.01)

(58) Field of Classification Search
None
See application file for complete search history.

(56) References Cited

U.S. PATENT DOCUMENTS

| 5,570,315 | A | 10/1996 | Tanaka et al. |
| 5,774,397 | A | 6/1998 | Endoh et al. |
| 5,887,145 | A | 3/1999 | Harari et al. |
| 6,046,935 | A | 4/2000 | Takeuchi et al. |
| 7,951,669 | B2 | 5/2011 | Harari et al. |
| 2007/0032067 | A1* | 2/2007 | Nakashima ....... H01L 21/76808 438/622 |

FOREIGN PATENT DOCUMENTS

| JP | 2011-181729 | 9/2011 |
| JP | 2013-105988 | 5/2013 |

* cited by examiner

*Primary Examiner* — Daniel Luke
(74) *Attorney, Agent, or Firm* — Davis Wright Tremaine LLP

(57) ABSTRACT

Contact holes are constrained to their designated active areas by etch-resistant walls so that they cannot contact adjacent active areas. Etch-resistant walls provide outer limits for any contact hole bending that may occur and thus keep contact holes substantially vertical. Mask openings for contact hole formation may be large so that they overlap etch-resistant walls.

15 Claims, 10 Drawing Sheets

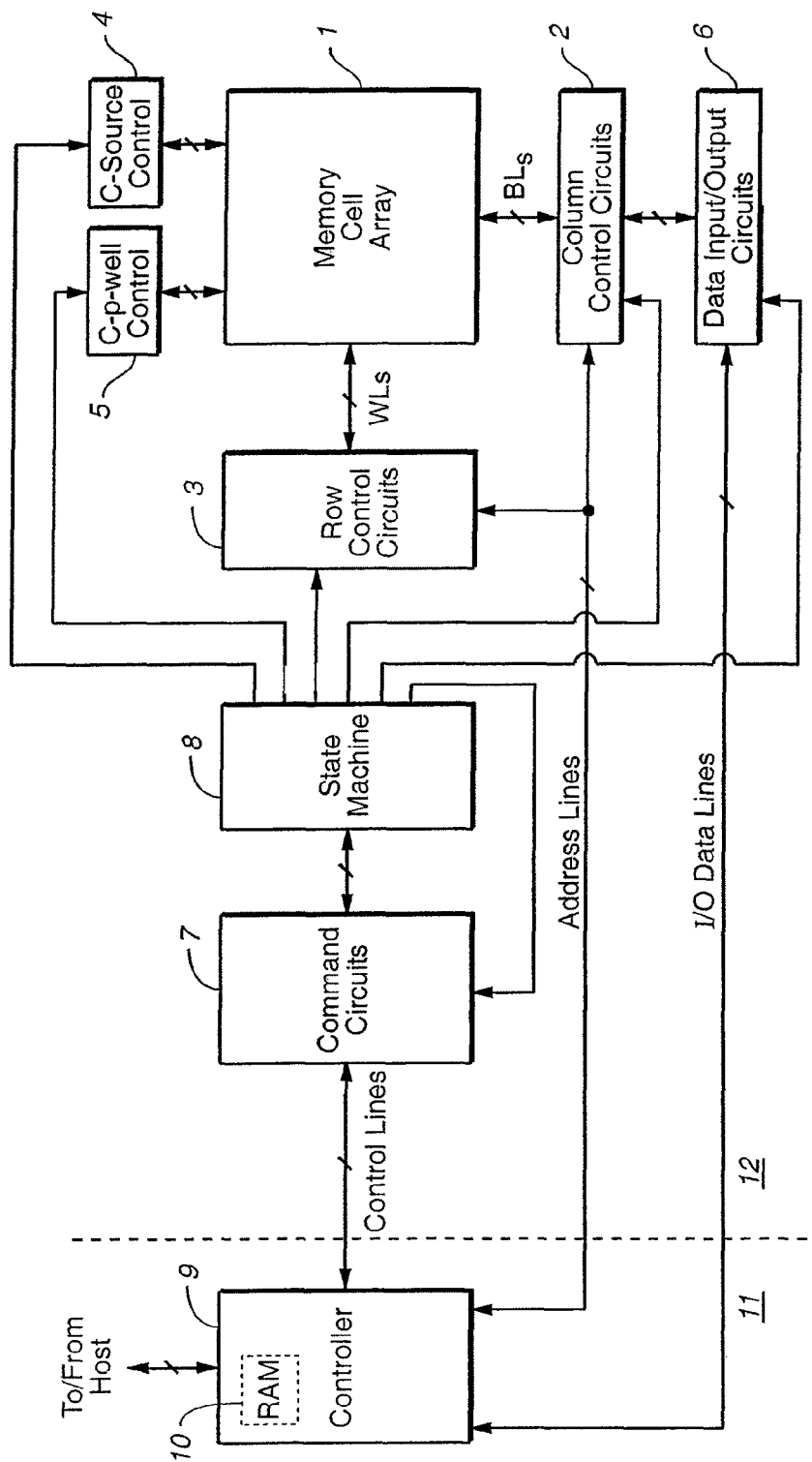
FIG._1
*(Prior Art)*

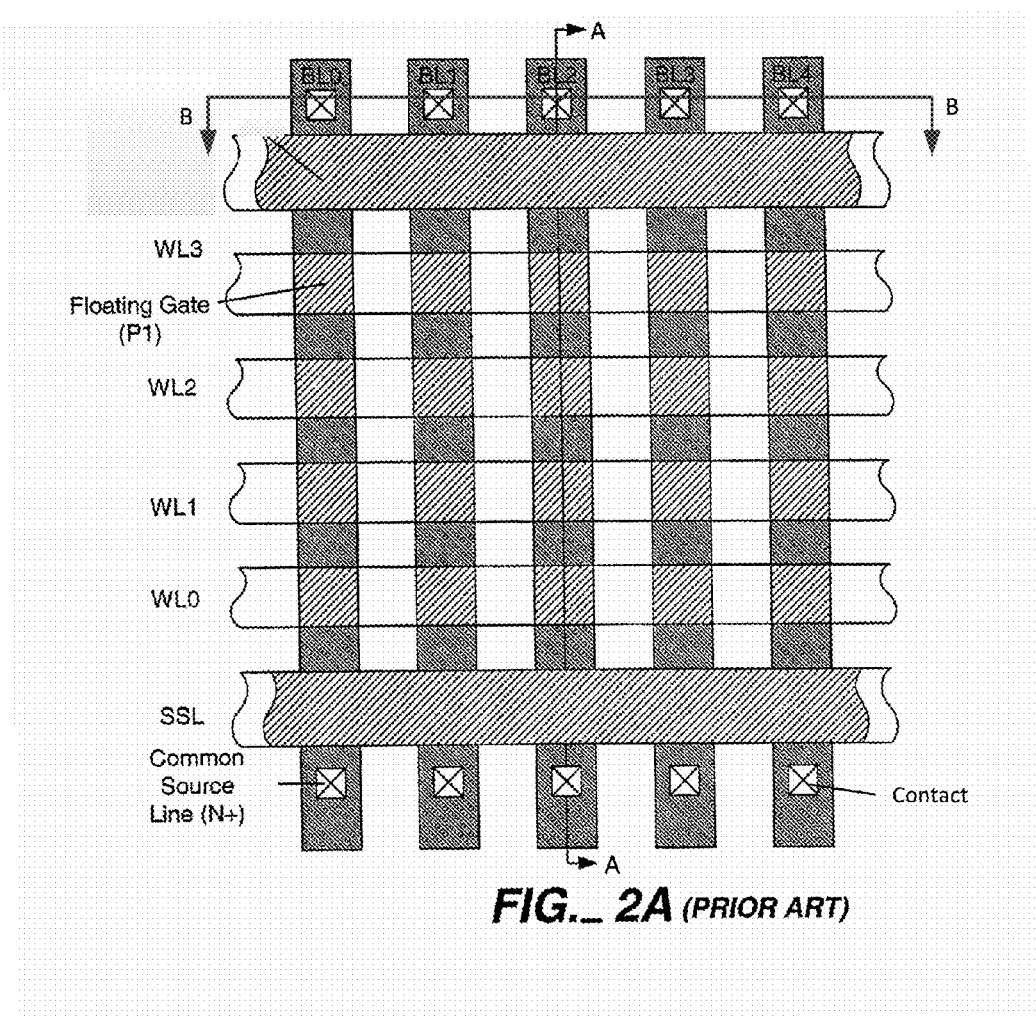
FIG._2A *(PRIOR ART)*
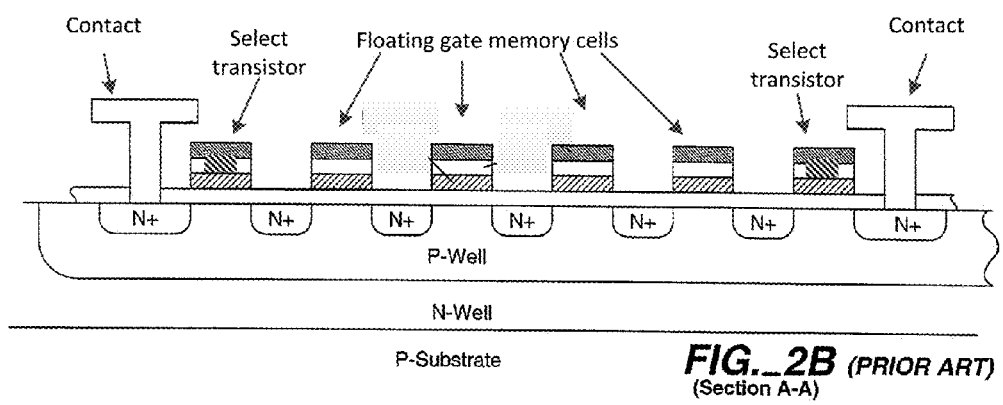
FIG._2B *(PRIOR ART)*
(Section A-A)

*(Section B-B)*

CONTACT HOLE COLLIMATION USING ETCH-RESISTANT WALLS

BACKGROUND OF THE INVENTION

This invention relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed by appropriately doping a portion of the substrate. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal. As dimensions of devices in the memory array get smaller, contact holes get smaller and control of contact hole formation may become more difficult.

Thus, there is a need for a memory chip manufacturing process that forms memory holes for contacting NAND strings with very small dimensions, and that allows good control of memory hole formation.

SUMMARY OF THE INVENTION

According to an example, contact holes that extend through a dielectric layer may be constrained to their designated active areas by etch-resistant walls so that they do not contact adjacent active areas. Etch-resistant walls provide outer limits for any contact hole bending that may occur. Etch-resistant walls may be formed by etching slits in a dielectric layer, prior to formation of contact holes in the dielectric layer, and filling the slits with etch-resistant material (e.g. silicon nitride). Mask openings for contact hole patterning may overlie etch-resistant walls thus allowing relatively large mask openings and providing good tolerance for misalignment of contact hole openings to etch-resistant walls. Etch-resistant walls may be formed so that each wall overlies an STI region and extends in the same direction as the STI regions (i.e. along the bit line direction). Alternatively, etch-resistant walls may extend obliquely and contact hole locations may be staggered along the bit line direction so that a wall lies between a contact hole and its nearest neighbor along the word line direction.

An example of a method of forming contact holes through a dielectric layer includes: depositing a first dielectric layer over a substrate, the first dielectric layer formed of a first dielectric material; subsequently forming a plurality of slits in the first dielectric layer; subsequently depositing a second dielectric material into the plurality of slits to form a plurality of walls of the second dielectric material; subsequently forming an etch mask to define contact hole openings in the first dielectric material in areas between walls; and subsequently etching a plurality of contact holes in the first dielectric layer, an individual contact hole formed between a first wall and a second wall of the plurality of walls, the plurality of contact holes etched by a process that provides a higher etch rate of the first dielectric material than the second dielectric material.

An individual wall of the plurality of walls may be elongated in a first direction across the substrate and has a width in a second direction across the substrate surface that is perpendicular to the first direction that is smaller than a diameter of an individual contact hole at the same height from the substrate. Prior to depositing the first dielectric layer, an underlying dielectric layer may be formed on which the first dielectric layer is subsequently deposited; subsequently the plurality of slits may be formed by etching through the first dielectric layer and stopping on the underlying dielectric layer using an etch that etches the first dielectric layer at a higher rate than the underlying dielectric layer. Subsequently the plurality of contact holes may be etched using a first etch that etches the first dielectric layer at a higher rate than the underlying dielectric layer and stops at the underlying dielectric layer; and subsequently using a second etch to extend the plurality of contact holes through the underlying dielectric layer. Depositing the second dielectric material into the plurality of slits to form a plurality of walls of the second dielectric material may include: depositing the second dielectric layer on the first dielectric layer; and subsequently performing etch-back of the second dielectric layer to expose the first dielectric layer using an etch that etches the first dielectric material and the second dielectric material at substantially the same rate. The first dielectric layer may extend over a substrate that includes alternating bit line Active Areas (AAs) and Shallow Trench Isolation (STI) regions, and the plurality of slits may be formed over STI regions to align the plurality of walls with the plurality of STI regions. The first dielectric material may be Silicon Dioxide (SiO2) and the second dielectric material may be Silicon Nitride (SiN). The plurality of walls may be formed to have a lateral dimension that is chosen to be sufficiently wide to constrain a contact hole to an active area and sufficiently narrow so that the electrical resistances of contacts formed in the plurality of contact holes are below a maximum resistance. An opening area of one slit may be larger than an opening area of one contact hole.

The substrate may include: first to sixth Active Areas (AAs) extending in a first direction; and first to sixth Shallow Trench Isolation (STI) regions extending in the first direction, wherein the AAs and the STI regions are arranged adjacently and alternately, first to sixth contact holes are formed on corresponding one of the first to sixth AAs, positions of the first contact hole and the fourth contact hole in the first direction are the same, positions of the second contact hole and the fifth contact hole in the first direction are the same, positions of the third contact hole and the sixth contact hole in the first direction are the same, the second contact hole and the fifth contact hole are formed by being separated by a predetermined distance in the first direction from the first contact hole, the third contact hole and the sixth contact hole are formed by being separated by a predetermined distance in the first direction from the second contact hole, the wall is arranged to include a region between the first contact hole and the fourth contact hole, a region between the second contact hole and the fifth contact hole, and a region between the third contact hole and the sixth contact hole, the wall is arranged to include parts of the first to sixth contact holes, and the wall is arranged to be oblique relative to the first direction. A center line passing through a center of the first contact hole, and extending in a second direction that is orthogonal to the first direction is defined, an intersection of the center line and a boundary between the first AA and the first STI region is defined as a first intersection, an intersection of the center line and a boundary between the first STI region and the second AA is defined as a second intersection, an intersection of the center line and a boundary between the third STI region and the third AA is defined as a third intersection, an intersection of the center line and a boundary between the third STI region and the fourth AA is defined as a fourth intersection, a position of the wall on a first side on the center line is between the first intersection and the second intersection, and a position of the wall on a second side on the center line is between the third intersection and the fourth intersection.

The substrate may include first to fourth Active Areas (AAs) extending in a first direction; and first to fourth Shallow Trench Isolation (STI) regions extending in the first direction, wherein the AAs and the STI regions are arranged adjacently and alternately, first to fourth contact holes are formed on corresponding one of the first to fourth AAs, positions of the first contact hole and the third contact hole in the first direction are the same, positions of the second contact hole and the fourth contact hole in the first direction are the same, the second contact hole and the fourth contact hole are formed by being separated by a predetermined distance in the first direction from the first contact hole, the wall is arranged to include a region between the first contact hole and the third contact hole, and a region between the second contact hole and the fourth contact hole, the wall is arranged to include parts of the first to fourth contact holes, and the wall is arranged to be oblique relative to the first direction.

A center line passing through a center of the first contact hole, and extending in a second direction that is orthogonal to the first direction is defined, an intersection of the center line and a boundary between the first AA and the first STI region is defined as a first intersection, an intersection of the center line and a boundary between the first STI region and the second AA is defined as a second intersection, an intersection of the center line and a boundary between the second AA and the second STI region is defined as a third intersection, an intersection of the center line and a boundary between the second STI region and the third AA is defined as a fourth intersection, a position of the wall on a first side on the center line is between the first intersection and the second intersection, and a position of the wall on a second side on the center line is between the third intersection and the fourth intersection.

An example of a method of controlling contact holes formed through a dielectric layer includes: forming a first slit and a second slit in the dielectric layer; filling the first slit with an etch-resistant material to form a first etch-resistant wall; filling the second slit with the etch-resistant material to form a second etch-resistant wall; and subsequently forming a contact hole through the dielectric layer between the first etch-resistant wall and the second etch-resistant wall using an etch chemistry that etches the dielectric layer at a significantly higher rate than the first and second etch-resistant walls.

The first and second etch-resistant walls may have a width at an upper surface of the dielectric layer that is greater than the diameter of the contact hole at the upper surface of the dielectric layer. The first and second etch-resistant walls may extend in a vertical direction that is substantially perpendicular to a primary surface of an underlying substrate and the contact hole deviates from the vertical direction to intersect the first etch-resistant wall. The contact hole may be constrained by at least one of the first etch-resistant wall and the second etch-resistant wall so that the contact hole remains substantially over an active area and a metal contact that is subsequently formed in the contact hole is formed over and in contact with the active area.

An example of a nonvolatile memory array includes: a plurality of active areas in a semiconductor substrate; a dielectric layer extending over the plurality of active areas; a plurality of walls extending through the dielectric layer overlying locations in the semiconductor substrate between active areas; and a plurality of contact holes extending through the dielectric layer at locations overlying active areas in the semiconductor substrate.

A contact hole may be constrained by a wall where the contact hole extends in a direction that is not perpendicular to a primary surface of the semiconductor substrate. A plurality of metal contacts may be formed in the plurality of contact holes. The plurality of metal contacts may form electrical connections with bit line active areas in the semiconductor substrate, a bit line active area connecting to an individual bit line that connects with a plurality of NAND strings.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 1 is a block diagram of a prior art memory system.

FIG. 2A is a plan view of a prior art NAND array.

FIG. 2B shows a cross section of the NAND array of FIG. 2A.

DETAILED DESCRIPTION OF EXEMPLARY EMBODIMENTS

Memory System

Figure 2C:
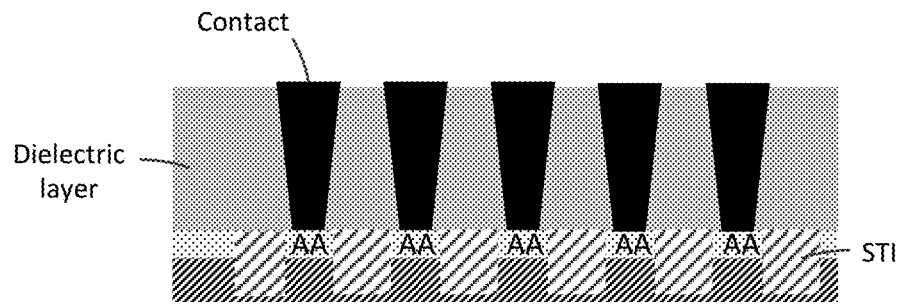
FIG. 2C shows another cross section of the NAND array of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

An example of a prior art memory system, which may be modified to include various aspects of the present invention, is illustrated by the block diagram of FIG. 1. A memory cell array 1 including a plurality of memory cells arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts are formed at either end to connect the NAND strings in the memory array (e.g. connecting to bit lines at one end and to a common source line at the other end). Such a contact may be formed of metal that is deposited into a contact hole that is formed in a dielectric layer. FIG. 2C shows a cross section along B-B of FIG. 2A. This view shows metal contacts extending down through contact holes in a dielectric layer to make contact with active areas ("AA") in the substrate (i.e. with N+ areas of FIG. 2B). STI regions are located between active areas of different strings to electrically isolate an individual NAND string from its neighbors.

As memory dimensions get smaller, some problems may be encountered when forming contact holes for electrical connection to NAND strings. In general, as such contact holes become narrower, and their cross sectional area (in plan view) becomes smaller, they become harder to control. In particular, narrow high-aspect ratio contact holes on at least some areas of a substrate such as a silicon wafer may not extend perpendicularly to the substrate surface. Instead, such contact holes may bend to one side, deviating from perpendicular, as they go down through a dielectric layer. This may be related to their location on a substrate or other factors. For example, memory holes in dies near the edge of a substrate may tend to bend significantly because of non-uniform etching conditions. This may become more severe over time as a process kit becomes worn (e.g. contact hole bending may only become significant after a number of substrates have been processed in a given etch chamber and only in certain areas of a substrate surface). Magnetic fields, electric fields, gas flows, temperature profiles, and other process parameters may vary across a wafer and over time. Such variation may provide at least some contact hole bending on at least some dies for at least some period of time. It will be understood that aspects of the present invention provide solutions to contact hole bending in general. The solutions presented here are not generally limited to contact hole bending due to a particular mechanism (i.e. the root cause of contact hole bending is generally not important when applying solutions presented here).

Figure 3:
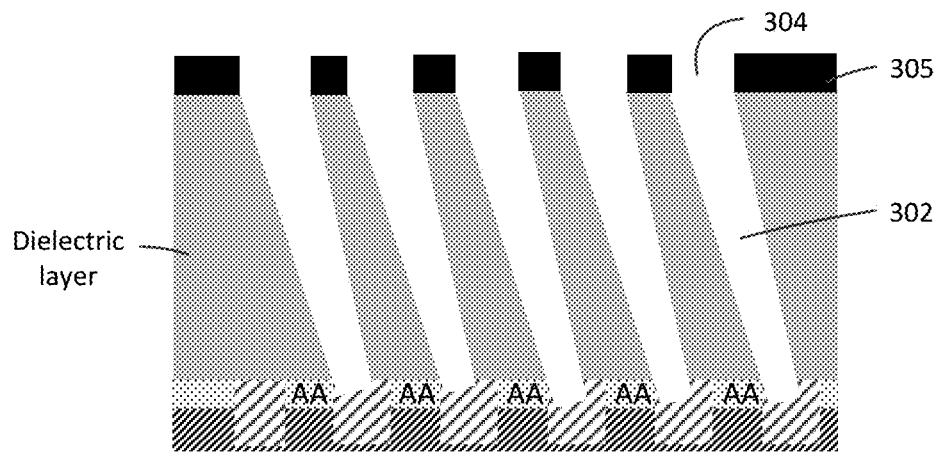
FIG. 3 illustrates an example of contact hole bending.

FIG. 3 illustrates how contact hole bending may affect contacts in NAND memories. Contact holes 302 are defined by a pattern of openings 304 in a masking layer 305 that is aligned with active areas that are to be contacted. When contact holes bend to one side as shown, there may be poor contact, or no contact with a corresponding active area. In some cases bending may cause a contact hole that is intended to contact a particular active area to contact a neighboring active area instead, or to contact both active areas thus shorting neighboring NAND strings.

Figure 4:
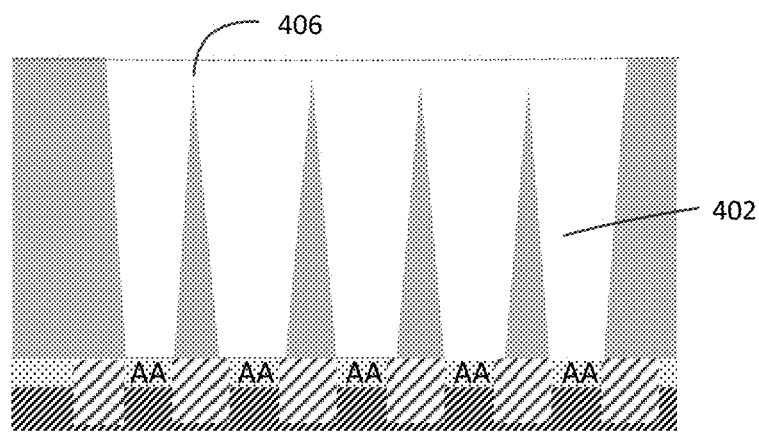
FIG. 4 illustrates an example of contact holes touching.

One way to deal with contact hole bending is to make contact holes wider so that bending is reduced. However, there are limits to how large a conventional contact hole can be made. FIG. 4 shows how contact holes 402 may be formed with large diameters that cause neighboring contact holes to merge as the contact holes are etched. If contact holes merge as shown at location 406, or if the amount of dielectric between such contact holes becomes too small, the resulting contacts may be electrically coupled together thus shorting out the bit lines to which they are connected. Thus, this approach does not provide a solution for all situations.

Figure 5:
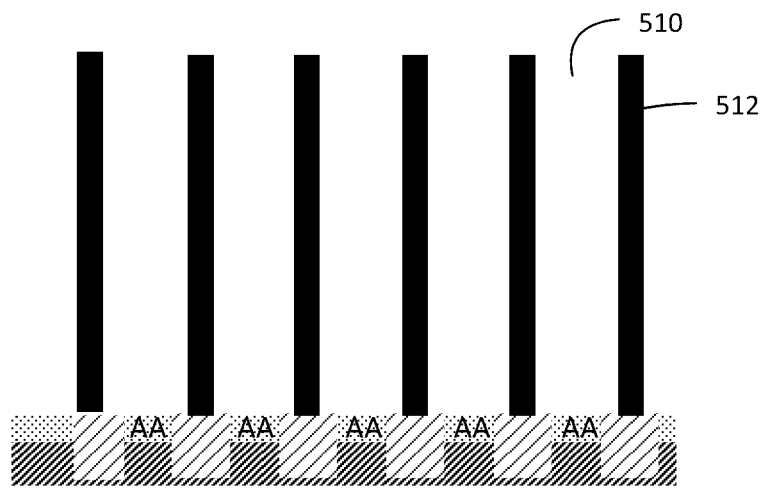
FIG. 5 shows contact holes that are collimated by etch-resistant walls.

According to an example presented here, contact holes with small areas are collimated so that even if bending occurs the resulting contact holes are constrained to a target area and do not affect adjacent areas. FIG. 5 shows a cross section of a plurality of contact holes 510. Etch-resistant walls 512 are provided to collimate contact holes 510. The etch-resistant walls 512 may be formed of a suitable material that is highly resistant to the etch used to form contact holes. Thus, the choice of material for the etch resistant walls depends on the etch process used to form contact holes (which in turn may depend on the dielectric through which the contact holes are formed and other factors). For example, where the dielectric is silicon dioxide or similar material and contact holes are etched by anisotropic dry etching (e.g. Reactive Ion Etching or RIE) silicon nitride may be chosen as a suitable material for etch resistant walls.

Figure 6:
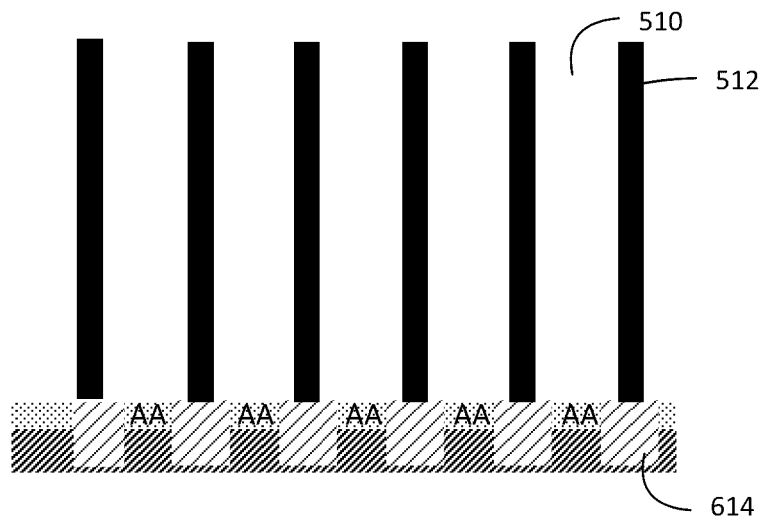
FIG. 6 shows another example of contact holes that are constrained by etch-resistant walls.

FIG. 6 shows an example of how etch-resistant walls 512 may prevent contact holes from extending beyond a target area. In particular, the etch-resistant walls 512 are located above STI regions 614 and thus tend to confine a given contact hole to an underlying active area by preventing any contact hole from extending significantly over the STI regions. As contact holes bend they encounter an etch-resistant wall and etching laterally in the direction of the wall slows to a very low rate. Etching continues in other directions so that the contact hole is redirected towards the active area it is intended to contact.

In some cases, etching may stop on a substrate surface where active areas are formed as shown in FIG. 6. However, depending on the etch used it may be difficult to stop abruptly at the surface based on etch time alone. Under-etching may leave some dielectric between a metal contact and an active area so that electrical connection is not made, or is poorly made. Over-etching may cause damage to the active area and/or STI which may affect subsequent operation. In some cases, small contact holes may show significant variation from contact hole to contact hole so that both under-etched and over-etched contact holes may be formed on the same substrate by the same conditions. There may not be an etch time that stops all contact holes at the substrate surface.

According to an example of a process, an etch stop layer may be provided under the dielectric layer (over the active area and STI) so that contact holes stop uniformly on the etch stop layer. The etch stop layer may be formed of a suitable dielectric material that has a low etch rate when exposed to the etch used to form contact holes.

Figure 7:
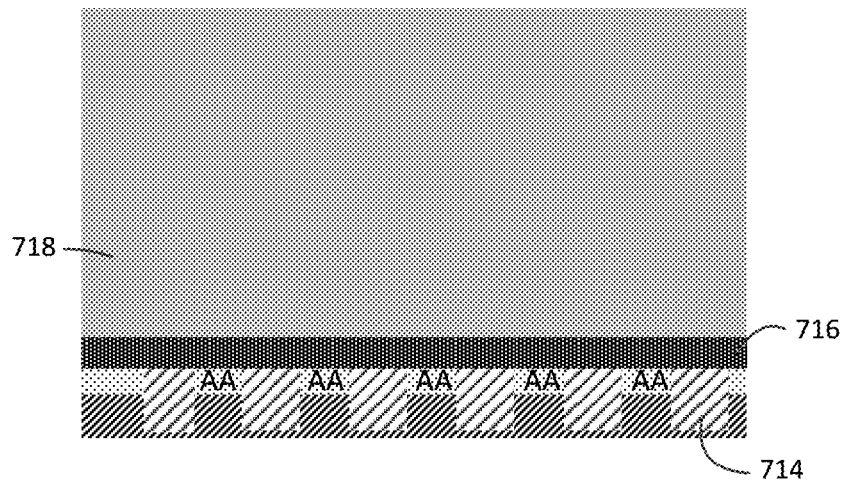
FIG. 7 shows an example of a NAND flash memory array at an intermediate stage of fabrication.

FIGS. 7-12 show an example of a process for forming contact holes through a dielectric layer so that contact holes are constrained within a target area. FIG. 7 shows a cross section of a substrate at an intermediate stage of fabrication with alternating active areas ("AA") and STI regions 714. An etch stop layer 716 overlies the active areas and STI regions and a dielectric layer 718 overlies the etch stop layer 716.

Figure 8:
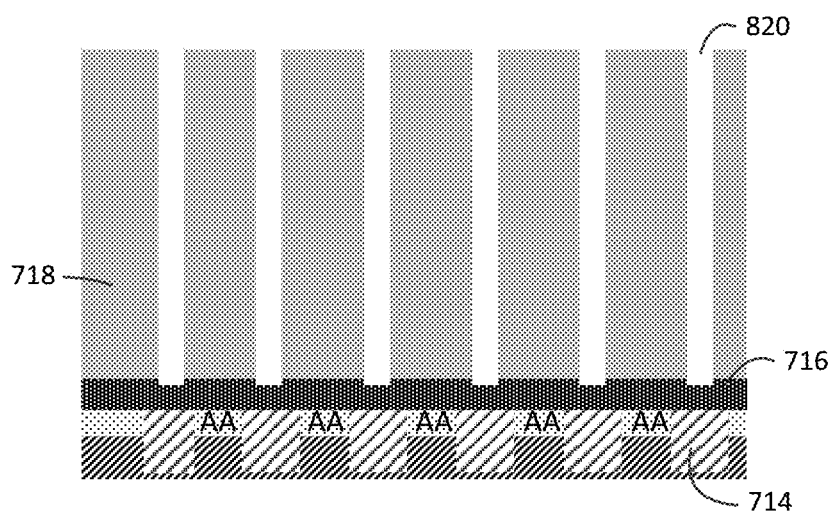
FIG. 8 shows the structure of FIG. 7 after formation of slits.

FIG. 8 shows the structure of FIG. 7 after formation of a plurality of slits 820 that extend down through dielectric layer 718. These slits may be formed by a process that ensures that they do not significantly bend. It has been found that bending is significant where the cross sectional area (in a horizontal plane) of a patterned opening is small. Because the slits extend for a significant length (in plan view) they have sufficient cross sectional area so that bending is not significant. Therefore, the slits may be substantially vertical as shown even under conditions that might produce contact hole bending for some contact holes. The slits 820 are aligned with STI regions 714 so that an individual slit overlies an STI region (i.e. lies between two active areas). The slits may be narrower than STI regions as shown, about the same width, or may be somewhat wider. The slits may be formed by a conventional patterning and etching process (e.g. RIE) and may stop on the etch stop layer 716 using a selective etch. Alternatively, a non-selective etch may be used in which case stopping may be time dependent. The location of the bottom of slits 820 may be located in STI regions 714, in etch stop layer 716, or above in dielectric layer 718.

Figure 9:
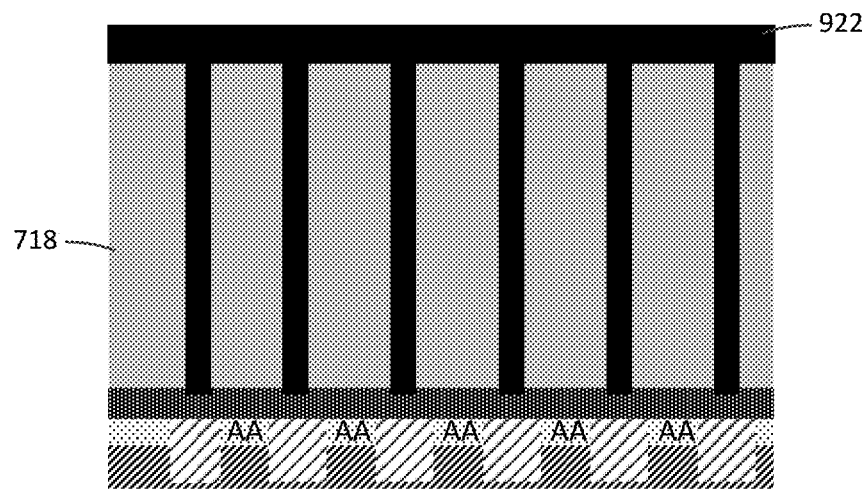
FIG. 9 shows the structure of FIG. 8 after deposition of etch-resistant material.

FIG. 9 shows the structure of FIG. 8 after deposition of an etch-resistant material 922 to fill slits 820. For example, silicon nitride may be deposited by Chemical Vapor Deposition (CVD) to fill slits. An appropriate CVD process may be chosen to allow filling of what may be considered high aspect ratio slits. Some of the etch-resistant material 922 overlies the dielectric layer 718 after this deposition step.

Figure 10:
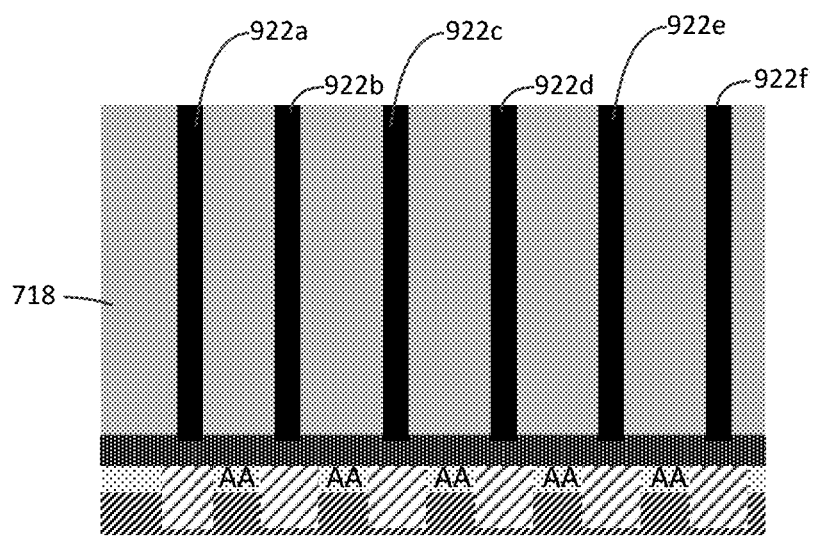
FIG. 10 shows the structure of FIG. 9 after etching back of etch-resistant material.

FIG. 10 shows the structure of FIG. 9 after removal of excess etch-resistant material 922 to form separate etch-resistant walls 922a-f. The etch-resistant material may be removed by Chemical Mechanical Polishing (CMP), etching, or otherwise. In an example, the excess etch-resistant material is etched-back using an etch process that removes etch-resistant material and material of dielectric layer 718 at approximately the same rate so that a substantially flat top surface is formed.

Figure 11:
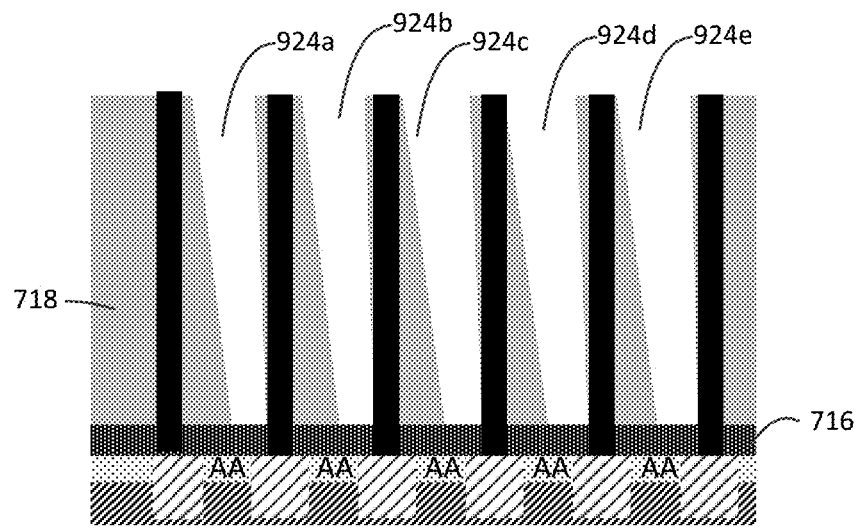
FIG. 11 shows the structure of FIG. 10 after formation of contact holes to an etch stop layer.

FIG. 11 shows the structure of FIG. 10 after formation of contact holes 924a-f. Contact holes may be formed by photolithographic patterning to form an etch mask with openings defining contact holes. Contact holes are then formed by anisotropic etching with the etch mask in place. The contact holes bend to one side. But instead of continuing towards neighboring active areas, the contact holes are constrained to their designated active area. The etch used to form the contact holes is selective to the material of the dielectric layer over the etch stop layer. That is, the etch removes material of dielectric layer 718 at a substantially higher rate than the material of the etch stop layer 716. Accordingly, etching stops on etch stop layer 716.

Figure 12:
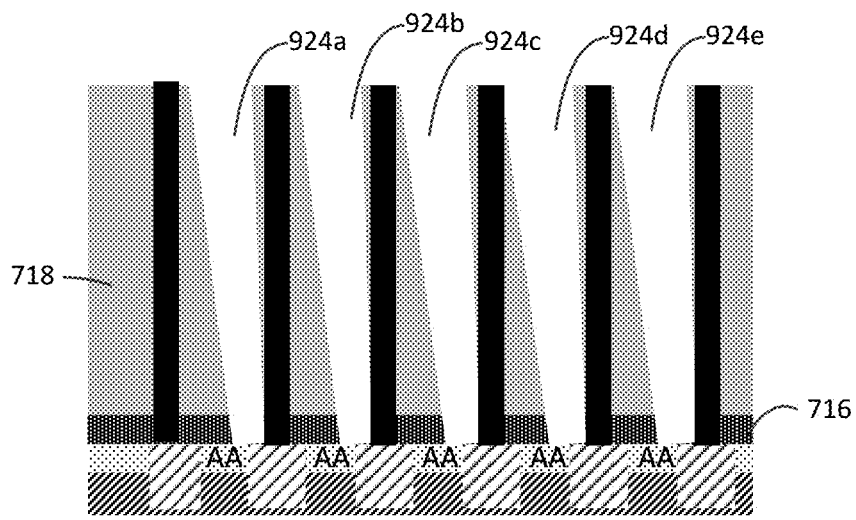
FIG. 12 shows the structure of FIG. 11 after extension of the contact holes through the etch stop layer.

FIG. 12 shows the structure of FIG. 11 after further etching, using different etch chemistry, to extend contact holes 924*a-e* through the etch stop layer 716. This further etching uses a chemistry that removes the etch stop layer at a significant rate. Thus, the etch stop layer operates as an effective etch stop for the first etch and is only substantially etched by the second etch. The contact holes 924*a-e* extend to active areas at this stage. Contacts may then be formed by depositing metal into the contact holes.

Figure 13:
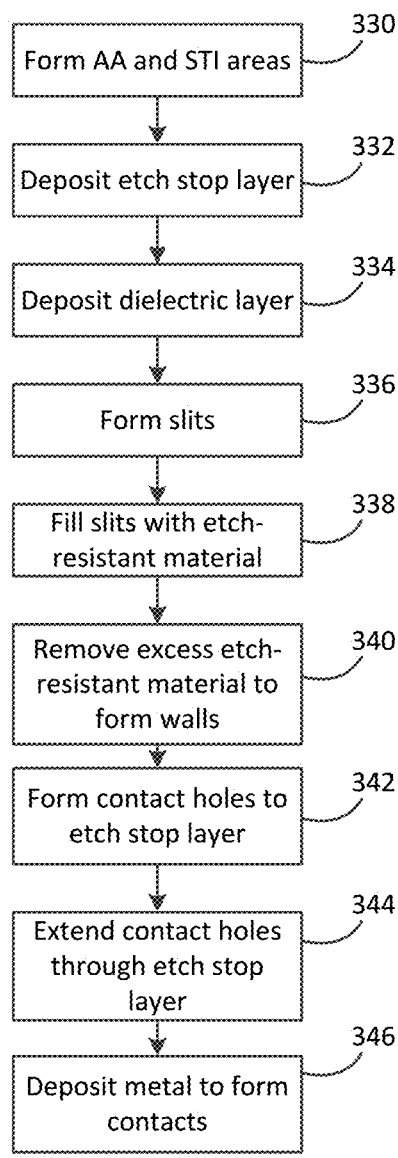
FIG. 13 shows example of a series of steps used to form contact holes.

FIG. 13 shows an example of a series of steps for forming contacts in a NAND flash memory. Active areas and STI areas are formed in a substrate 330. Subsequently, an etch stop layer is deposited 332 and a dielectric layer is deposited over the etch stop layer 334. Slits are then formed 336 in the etch stop layer at locations overlying STI areas. The slits are filled with an etch-resistant material 338 (e.g. silicon nitride). Excess etch-resistant material is then removed (e.g. etched back) to form separate etch-resistant walls 340. Contact holes are then formed 342 by etching down to the etch stop layer. The contact holes are subsequently extended through the etch stop layer 344 using a different etch. This exposes the active areas. Metal can then be deposited in the contact holes to form contacts 346.

It will be understood that the process steps described above provide an example and other processes may be used to form walls that constrain contact holes. The choice of process steps may depend on a number of factors including compatibility with other process steps.

Figure 14:
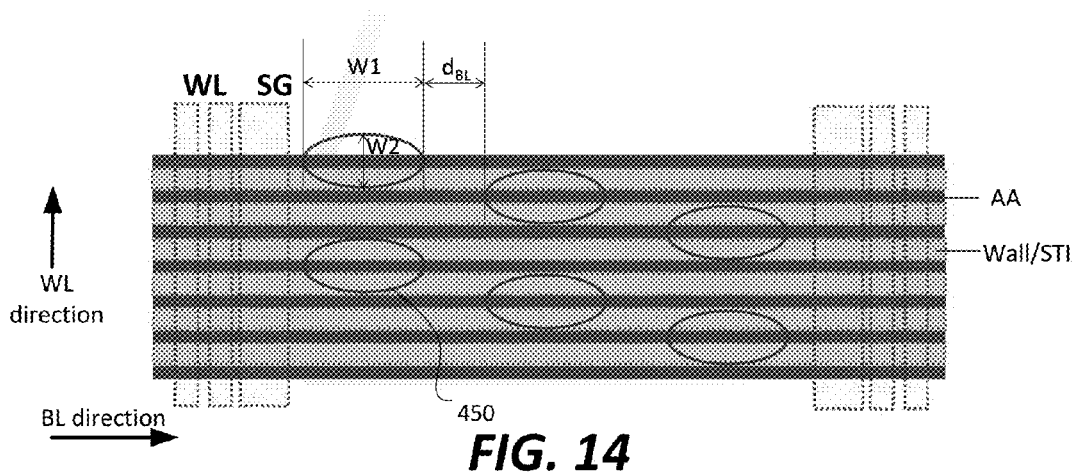
FIG. 14 shows an example of contact holes and etch-resistant walls in plan view.

Etch-resistant walls and contact holes may be arranged in various geometries. FIGS. 2A-C showed all contacts in a row. In other examples, all contacts may not be aligned in a single row. FIG. 14 shows (in top-down plan view) a first example in which contacts holes connect to active areas ("AA") located between select gates. Mask openings, such as opening 450, that define contact holes are not circular in this plan view. They are wider along the bit line (dimension W1) direction than along the word line direction (dimension W2). It will be understood that the dimension along the word line direction may be limited by memory geometry. An individual opening may extend over walls (and underlying STI regions) on either side of a particular active area because the resulting opening will be confined to the volume between neighboring walls. It is generally undesirable to have an opening extending over an adjacent active area which could allow contact to the adjacent active area. Therefore, an upper limit for a contact hole extent along the word line direction (W2) may be approximately 1.5*(bit line pitch). In contrast, along the bit line direction this limit does not apply and the opening may be wider (W1) in this direction. Wider openings in this direction increase the cross sectional area of contact holes (in horizontal plane) and thereby reduce the risk of bending. Furthermore, the resulting contacts have larger cross sectional area and therefore have lower resistance. It can be seen that contact hole openings for adjacent bit lines are offset from each along the bit line direction so that the risk of two such contact holes contacting is reduced. The distance between such contact hole openings along the bit line direction $d_{BL}$ may be sufficient to reduce risk of contact.

Figure 15:
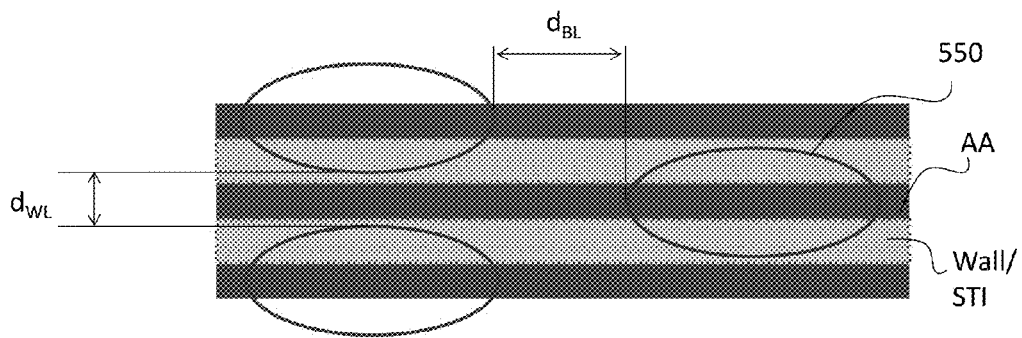
FIG. 15 shows another example of contact holes and etch-resistant walls in plan view.

FIG. 15 shows another arrangement in which contact hole openings 550 are arranged in a periodic pattern that repeats every two bit lines. In other arrangements, a pattern may repeat every n bit lines, where n may be more than two (or n may be 3 as in FIG. 14). Thus, contact holes that are at the same location along the bit line direction (aligned along the word line direction) are relatively widely separated in the word line direction (by $d_{WL}$). Contact holes are also separated from each other along the bit line direction by $d_{BL}$ in this example.

Figure 16:
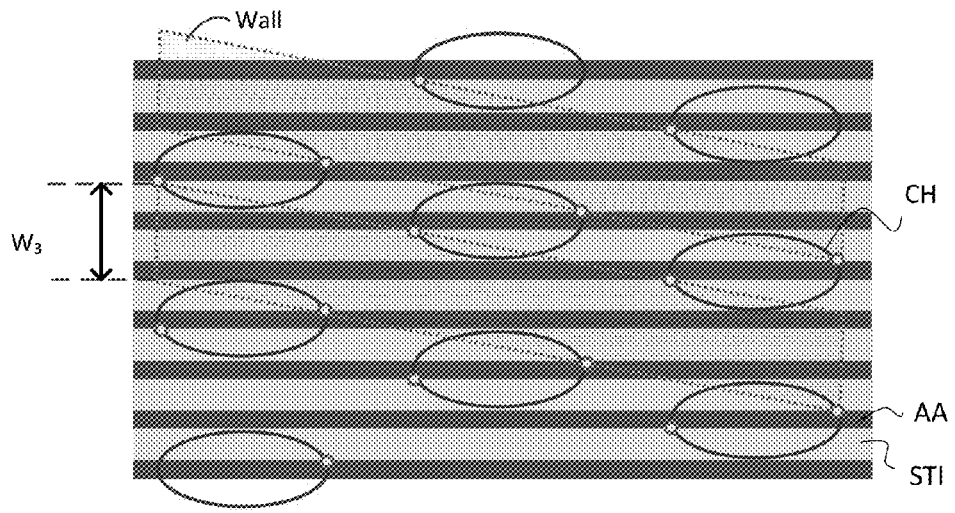
FIG. 16 shows another example of contact holes and etch-resistant walls in plan view.

FIG. 16 shows an arrangement in which etch-resistant walls extend obliquely instead of extending along the bit line direction as in previous examples. One advantage of such an arrangement is that relatively wide walls may be used. Where walls extend along the bit line direction over STI regions, they are generally limited to the width of the STI regions (which may be about half the pitch). In contrast, the etch-resistant walls of FIG. 16 are much wider. The dimension W3 along the word line direction is approximately twice the pitch, or about four times the wall thickness of the second last example (the example as shown FIG. 14).

Figure 17A:
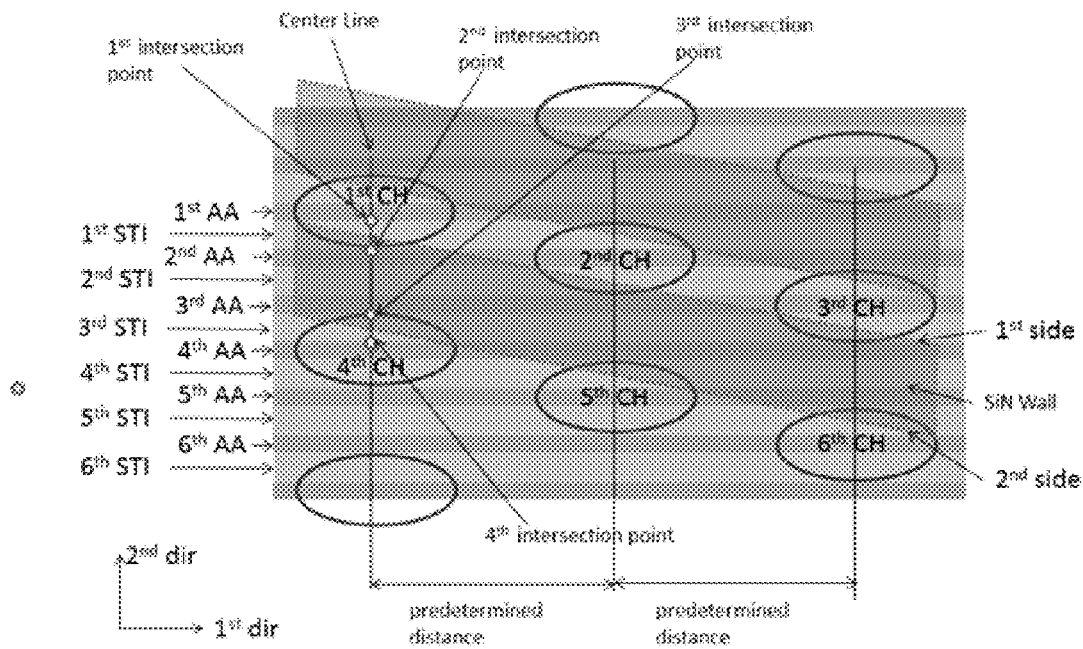
FIGS. 17A-17B show another example of contact holes and etch-resistant walls that extend in an oblique direction with respect to bit lines.
Figure 17B:
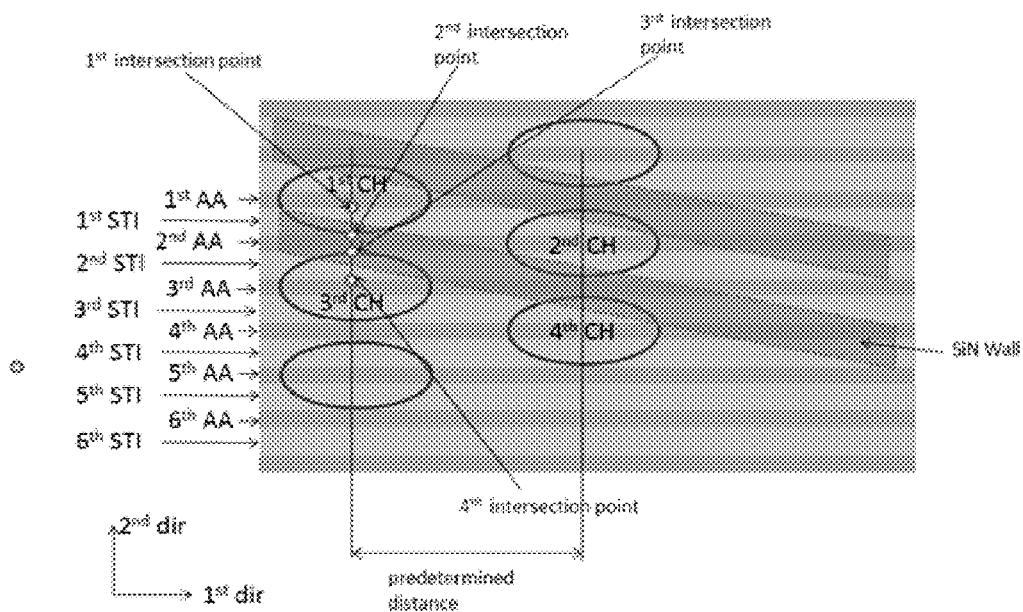

FIGS. 17A and 17B provide a detailed example of an arrangement of contact holes. FIG. 17A shows a substrate that includes six active areas ($1^{st}$ AA to $6^{th}$ AA) and six STI regions ($1^{st}$ STI to $6^{th}$ STI) that extend in the bit line direction ($1^{st}$ direction). AAs and STIs alternate along the word line direction ($2^{nd}$ direction) as shown. Six contact holes, $1^{st}$ CH to $6^{th}$ CH, are located over active $1^{st}$ to $6^{th}$ AAs respectively. The $1^{st}$ CH and $4^{th}$ CH are aligned so that they have a common center line that extends in the word line direction. Similarly, $2^{nd}$ and $5^{th}$ CHs are aligned with a common center line, and $3^{rd}$ and $6^{th}$ CHs are aligned with a common center line. These center lines are a predetermined distance apart. A wall extends between the $1^{st}$ and $4^{th}$ CHs, between the $2^{nd}$ and $5^{th}$ CHs, and between the $3^{rd}$ and $6^{th}$ CHs. The wall extends obliquely with respect to the first direction so that the wall crosses multiple active areas. Thus, FIG. 17A shows an example where substrate includes: first to sixth Active Areas (AAs) extending in a first direction; and first to sixth Shallow Trench Isolation (STI) regions extending in the first direction, wherein the AAs and the STI regions are arranged adjacently and alternately, e.g., the first AA, the first STI region, the second AA, the second STI region, and so on, first to sixth contact holes are formed on corresponding one of the first to sixth AAs, positions of the first contact hole and the fourth contact hole in the first direction are the same, positions of the second contact hole and the fifth contact hole in the first direction are the same, positions of the third contact hole and the sixth contact hole in the first direction are the same, the second contact hole and the fifth contact hole are formed by being separated by a predetermined distance in the first direction from the first contact hole, the third contact hole and the sixth contact hole are formed by being separated by a predetermined distance in the first direction from the second contact hole, the wall is arranged to include a region between the first contact hole and the fourth contact hole, a region between the second contact hole and the fifth contact hole, and a region between the third contact hole and the sixth contact hole, the wall is arranged to include parts of the first to sixth contact holes, and the wall is arranged to be oblique relative to the first direction.

FIG. 17B shows another view of the substrate in which certain intersection points are indicated. In FIG. 17B a center line passing through a center of the first contact hole, and extending in a second direction that is orthogonal to the first direction is defined, an intersection of the center line and a boundary between the first AA and the first SIT region is defined as a first intersection, an intersection of the center line and a boundary between the first STI region and the second AA is defined as a second intersection, an intersection of the center line and a boundary between the third STI region and the third AA is defined as a third intersection, an intersection of the center line and a boundary between the third STI region and the fourth AA is defined as a fourth intersection, a position of the wall on a first side on the center line is between the first intersection and the second intersection, and a position of the wall on a second side on the center line is between the third intersection and the fourth intersection.

It can be seen in FIGS. 17A and 17B that the substrate comprises: first to fourth Active Areas (AAs) extending in a first direction; and first to fourth Shallow Trench Isolation (STI) regions extending in the first direction, wherein the AAs and the STI regions are arranged adjacently and alternately, e.g., the first AA, the first STI region, the second AA, the second STI region, first to fourth contact holes are formed on corresponding one of the first to fourth AAs, positions of the first contact hole and the third contact hole in the first direction are the same, positions of the second contact hole and the fourth contact hole in the first direction are the same, the second contact hole and the fourth contact hole are formed by being separated by a predetermined distance in the first direction from the first contact hole, the wall is arranged to include a region between the first contact hole and the third contact hole, and a region between the second contact hole and the fourth contact hole, the wall is arranged to include parts of the first to fourth contact holes, and the wall is arranged to be oblique relative to the first direction. Furthermore, FIGS. 17A and 17B show a center line passing through a center of the first contact hole, and extending in a second direction that is orthogonal to the first direction is defined, an intersection of the center line and a boundary between the first AA and the first STI region is defined as a first intersection, an intersection of the center line and a boundary between the first STI region and the second AA is defined as a second intersection, an intersection of the center line and a boundary between the second AA and the second STI region is defined as a third intersection, an intersection of the center line and a boundary between the second STI region and the third AA is defined as a fourth intersection, a position of the wall on a first side on the center line is between the first intersection and the second intersection, and a position of the wall on a second side on the center line is between the third intersection and the fourth intersection.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of forming contact holes through a dielectric layer comprising:
    forming an underlying dielectric layer over a substrate;
    subsequently depositing a first dielectric layer on the underlying dielectric layer, the first dielectric layer formed of a first dielectric material;
    subsequently forming a plurality of slits in the first dielectric layer by etching through the first dielectric layer and stopping on the underlying dielectric layer using an etch that etches the first dielectric layer at a higher rate than the underlying dielectric layer;
    subsequently depositing a second dielectric material into the plurality of slits to form a plurality of walls of the second dielectric material;
    subsequently forming an etch mask to define contact hole openings in the first dielectric material in areas between walls; and
    subsequently etching a plurality of contact holes in the first dielectric layer using a first etch that etches the first dielectric layer at a higher rate than the underlying dielectric layer and stops at the underlying dielectric layer and subsequently using a second etch to extend the plurality of contact holes through the underlying dielectric layer, an individual contact hole formed between a first wall and a second wall of the plurality of walls, the plurality of contact holes etched by a process that provides a higher etch rate of the first dielectric material than the second dielectric material.

2. The method of claim 1 wherein
    an individual wall of the plurality of walls is elongated in a first direction across the substrate and has a width in a second direction across the substrate surface that is perpendicular to the first direction that is smaller than a diameter of an individual contact hole at the same height from the substrate.

3. The method of claim 1 wherein depositing the second dielectric material into the plurality of slits to form a plurality of walls of the second dielectric material comprises:
    depositing the second dielectric layer on the first dielectric layer; and
    subsequently performing etch-back of the second dielectric layer to expose the first dielectric layer using an etch that etches the first dielectric material and the second dielectric material at substantially the same rate.

4. The method of claim 1 wherein the substrate includes alternating bit line Active Areas (AAs) and Shallow Trench Isolation (STI) regions, and wherein the plurality of slits are formed over STI regions to align the plurality of walls with the plurality of STI regions.

5. The method of claim 1 wherein the first dielectric material is Silicon Dioxide (SiO2) and the second dielectric material is Silicon Nitride (SiN).

6. The method of claim 1 wherein the plurality of walls are formed to have a lateral dimension that is chosen to be sufficiently wide to constrain a contact hole to an active area.

7. The method of claim 1 wherein an opening area of one slit is larger than an opening area of one contact hole.

8. The method of claim 1, wherein
    the substrate comprises:
        first to sixth Active Areas (AAs) extending in a first direction; and
        first to sixth Shallow Trench Isolation (STI) regions extending in the first direction,
        wherein the AAs and the STI regions are arranged adjacently and alternately,
    first to sixth contact holes are formed on corresponding one of the first to sixth AAs,
    positions of the first contact hole and the fourth contact hole in the first direction are the same,
    positions of the second contact hole and the fifth contact hole in the first direction are the same,
    positions of the third contact hole and the sixth contact hole in the first direction are the same,
    the second contact hole and the fifth contact hole are formed by being separated by a predetermined distance in the first direction from the first contact hole, the third contact hole and the sixth contact hole are formed by being separated by a predetermined distance in the first direction from the second contact hole, the wall is arranged to include a region between the first contact hole and the fourth contact hole, a region between the second contact hole and the fifth contact hole, and a region between the third contact hole and the sixth contact hole, the wall is arranged to include parts of the first to sixth contact holes, and the wall is arranged to be oblique relative to the first direction.

9. The method of claim 8, wherein a center line passing through a center of the first contact hole, and extending in a second direction that is orthogonal to the first direction is defined, an intersection of the center line and a boundary between the first AA and the first STI region is defined as a first intersection, an intersection of the center line and a boundary between the first STI region and the second AA is defined as a second intersection, an intersection of the center line and a boundary between the third STI region and the third AA is defined as a third intersection, an intersection of the center line and a boundary between the third STI region and the fourth AA is defined as a fourth intersection, a position of the wall on a first side on the center line is between the first intersection and the second intersection, and a position of the wall on a second side on the center line is between the third intersection and the fourth intersection.

10. The method of claim 1 wherein the substrate comprises:

first to fourth Active Areas (AAs) extending in a first direction; and first to fourth Shallow Trench Isolation (STI) regions extending in the first direction, wherein the AAs and the STI regions are arranged adjacently and alternately, first to fourth contact holes are formed on corresponding one of the first to fourth AAs, positions of the first contact hole and the third contact hole in the first direction are the same, positions of the second contact hole and the fourth contact hole in the first direction are the same, the second contact hole and the fourth contact hole are formed by being separated by a predetermined distance in the first direction from the first contact hole, the wall is arranged to include a region between the first contact hole and the third contact hole, and a region between the second contact hole and the fourth contact hole, the wall is arranged to include parts of the first to fourth contact holes, and the wall is arranged to be oblique relative to the first direction.

11. The method of claim 10, wherein a center line passing through a center of the first contact hole, and extending in a second direction that is orthogonal to the first direction is defined, an intersection of the center line and a boundary between the first AA and the first STI region is defined as a first intersection, an intersection of the center line and a boundary between the first STI region and the second AA is defined as a second intersection, an intersection of the center line and a boundary between the second AA and the second STI region is defined as a third intersection, an intersection of the center line and a boundary between the second STI region and the third AA is defined as a fourth intersection, a position of the wall on a first side on the center line is between the first intersection and the second intersection, and a position of the wall on a second side on the center line is between the third intersection and the fourth intersection.

12. A method of controlling contact holes formed through a dielectric layer on an etch-stop layer comprising:

forming a first slit and a second slit in the dielectric layer, the first and second slits formed by etching through the dielectric layer and stopping on the etch-stop layer using an etch that etches the dielectric layer at a higher rate than the etch-stop layer;

filling the first slit with an etch-resistant material to form a first etch-resistant wall;

filling the second slit with the etch-resistant material to form a second etch-resistant wall; and subsequently forming a contact hole through the dielectric layer between the first etch-resistant wall and the second etch-resistant wall by using a first etch that etches the dielectric layer at a higher rate than the etch-stop layer and stops at the etch-stop layer, the first etch using an etch chemistry that etches the dielectric layer at a significantly higher rate than the first and second etch-resistant walls and subsequently using a second etch to extend the plurality of contact holes through the etch-stop layer.

13. The method of claim 12 wherein the first and second etch-resistant walls have a width at an upper surface of the dielectric layer that is less than the diameter of the contact hole at the upper surface of the dielectric layer.

14. The method of claim 12 wherein the first and second etch-resistant walls extend in a vertical direction that is substantially perpendicular to a primary surface of an underlying substrate and the contact hole deviates from the vertical direction to intersect the first etch-resistant wall.

15. The method of claim 14 wherein the contact hole is constrained by at least one of the first etch-resistant wall and the second etch-resistant wall so that the contact hole remains substantially over an active area and a metal contact that is subsequently formed in the contact hole is formed over and in contact with the active area.

* * * * *